United States Patent
Hochman

(10) Patent No.: US 10,990,713 B1
(45) Date of Patent: Apr. 27, 2021

(54) SYSTEMS AND METHODS FOR FAST MATRIX DECOMPOSITION IN MODEL GENERATION

(71) Applicant: Ansys, Inc., Canonsburg, PA (US)

(72) Inventor: Amit Hochman, Somerville, MA (US)

(73) Assignee: Ansys, Inc., Canonsburg, PA (US)

(*) Notice: Subject to any disclaimer, the term of this patent is extended or adjusted under 35 U.S.C. 154(b) by 686 days.

(21) Appl. No.: 14/824,387

(22) Filed: Aug. 12, 2015

Related U.S. Application Data

(60) Provisional application No. 62/036,763, filed on Aug. 13, 2014.

(51) Int. Cl.
   *G06F 30/20* (2020.01)
   *G06F 17/16* (2006.01)

(52) U.S. Cl.
   CPC .............. *G06F 30/20* (2020.01); *G06F 17/16* (2013.01)

(58) Field of Classification Search
   CPC .. G06F 17/5045; G06F 17/16; G06F 17/3069; G06F 17/12; G06F 17/10; A61B 8/00; G06K 9/6224; G01R 31/3648; G01R 31/364; G01V 3/083; E21B 44/00; H04B 7/024
   See application file for complete search history.

(56) References Cited

U.S. PATENT DOCUMENTS

| | | | | |
|---|---|---|---|---|
| 8,504,345 | B1* | 8/2013 | Tsuk | G06F 17/5045 703/13 |
| 2005/0234686 | A1* | 10/2005 | Cheng | G06F 17/12 703/2 |
| 2009/0216821 | A1* | 8/2009 | Nakamura | G06F 17/16 708/446 |
| 2009/0248373 | A1* | 10/2009 | Druskin | G01V 3/083 703/2 |
| 2012/0163691 | A1* | 6/2012 | Walker | A61B 8/00 382/131 |
| 2012/0278021 | A1* | 11/2012 | Lin | G06F 17/10 702/85 |
| 2012/0296891 | A1* | 11/2012 | Rangan | G06F 17/3069 707/722 |

(Continued)

OTHER PUBLICATIONS

Wang et al., "Thermal-ADI: a linear-time chip-level dynamic thermal simulation algorithm based on Alternating direction implicit method", ACM 2001.*

*Primary Examiner* — Kandasamy Thangavelu
(74) *Attorney, Agent, or Firm* — Jones Day

(57) ABSTRACT

Systems and methods are provided for generating a state space model of a physical system. A matrix decomposition module is configured to receive input data and determine a size of an input matrix based on the input data. When the input matrix size is below a threshold, a singular value decomposition of the input matrix is determined using a first technique. When the input matrix size is above the threshold the input matrix is subdivided into a plurality of subparts. For each subpart, a separability value of that subpart is determined. When the separability value indicates that the subpart is well separated, a singular value decomposition of that subpart is determined using a second technique. When the separability value indicates that the subpart is not well separated, data associated with that subpart is provided to the matrix decomposition module via a recursive call.

23 Claims, 6 Drawing Sheets

(56) References Cited

U.S. PATENT DOCUMENTS

| | | | |
|---|---|---|---|
| 2013/0054603 A1* | 2/2013 | Birdwell | G06K 9/6224 707/738 |
| 2015/0226049 A1* | 8/2015 | Frangos | E21B 44/00 702/6 |
| 2015/0304867 A1* | 10/2015 | Aulin | H04B 7/024 370/252 |
| 2016/0018471 A1* | 1/2016 | Lee | G01R 31/3648 702/63 |

* cited by examiner

SYSTEMS AND METHODS FOR FAST MATRIX DECOMPOSITION IN MODEL GENERATION

CROSS-REFERENCE TO RELATED APPLICATIONS

This application claims priority to U.S. Provisional Patent Application No. 62/036,763, filed on Aug. 13, 2014, entitled "Systems and Methods for Fast Matrix Decomposition in Model Generation," the entirety of which is herein incorporated by reference.

FIELD

This disclosure is related generally to model generation and more particularly to matrix decomposition for state space model generation.

BACKGROUND

Models of a physical system, such as a state space model, are useful for predicting real-world behaviors of that system. Using such models, inputs to the system or the system itself may be varied to simulate a wide variety of behaviors quickly, without requiring building or testing of the actual physical system itself. Model accuracy is often of high importance, as confidence that the model behaves substantially similarly to the physical system provides confidence in the simulation results. Oftentimes, techniques to generate an accurate model are significantly and sometimes prohibitively time consuming.

SUMMARY

Systems and methods are provided for generating a state space model of a physical system. A system includes a physical system data structure containing data associated with a physical system. A matrix decomposition module is configured to determine a singular value decomposition of an input matrix. The matrix decomposition module is configured to receive input data and determine a size of an input matrix based on the input data. When the input matrix size is below a threshold, a singular value decomposition of the input matrix is determined using a first technique. When the input matrix size is above the threshold the input matrix is subdivided into a plurality of subparts. For each subpart, a separability value of that subpart is determined. When the separability value indicates that the subpart is well separated, a singular value decomposition of that subpart is determined using a second technique. When the separability value indicates that the subpart is not well separated, data associated with that subpart is provided to the matrix decomposition module via a recursive call. The singular value decompositions of each of the subparts are combined to form the singular value decomposition of the input matrix. The singular value decomposition of the input matrix is outputted from the matrix decomposition module. A model generation module is configured to generate a state space model of the physical system based on a singular value decomposition associated with data from the physical system data structure received from the matrix decomposition module.

As another example, a method of generating a state space model of a physical system receives a physical system data structure containing data associated with a physical system. Input data is provided to a matrix decomposition module that is configured to determine a singular value decomposition of an input matrix. The matrix decomposition module is configured to receive the input data and determine a size of an input matrix based on the input data. When the input matrix size is below a threshold, a singular value decomposition of the input matrix is determined using a first technique. When the input matrix size is above the threshold the input matrix is subdivided into a plurality of subparts. For each subpart, a separability value of that subpart is determined. When the separability value indicates that the subpart is well separated, a singular value decomposition of that subpart is determined using a second technique. When the separability value indicates that the subpart is not well separated, data associated with that subpart is provided to the matrix decomposition module via a recursive call. The singular value decompositions of each of the subparts are combined to form the singular value decomposition of the input matrix. The singular value decomposition of the input matrix is outputted from the matrix decomposition module. A model generation module is configured to generate a state space model of the physical system based on a singular value decomposition associated with data from the physical system data structure received from the matrix decomposition module.

DETAILED DESCRIPTION

Figure 1:
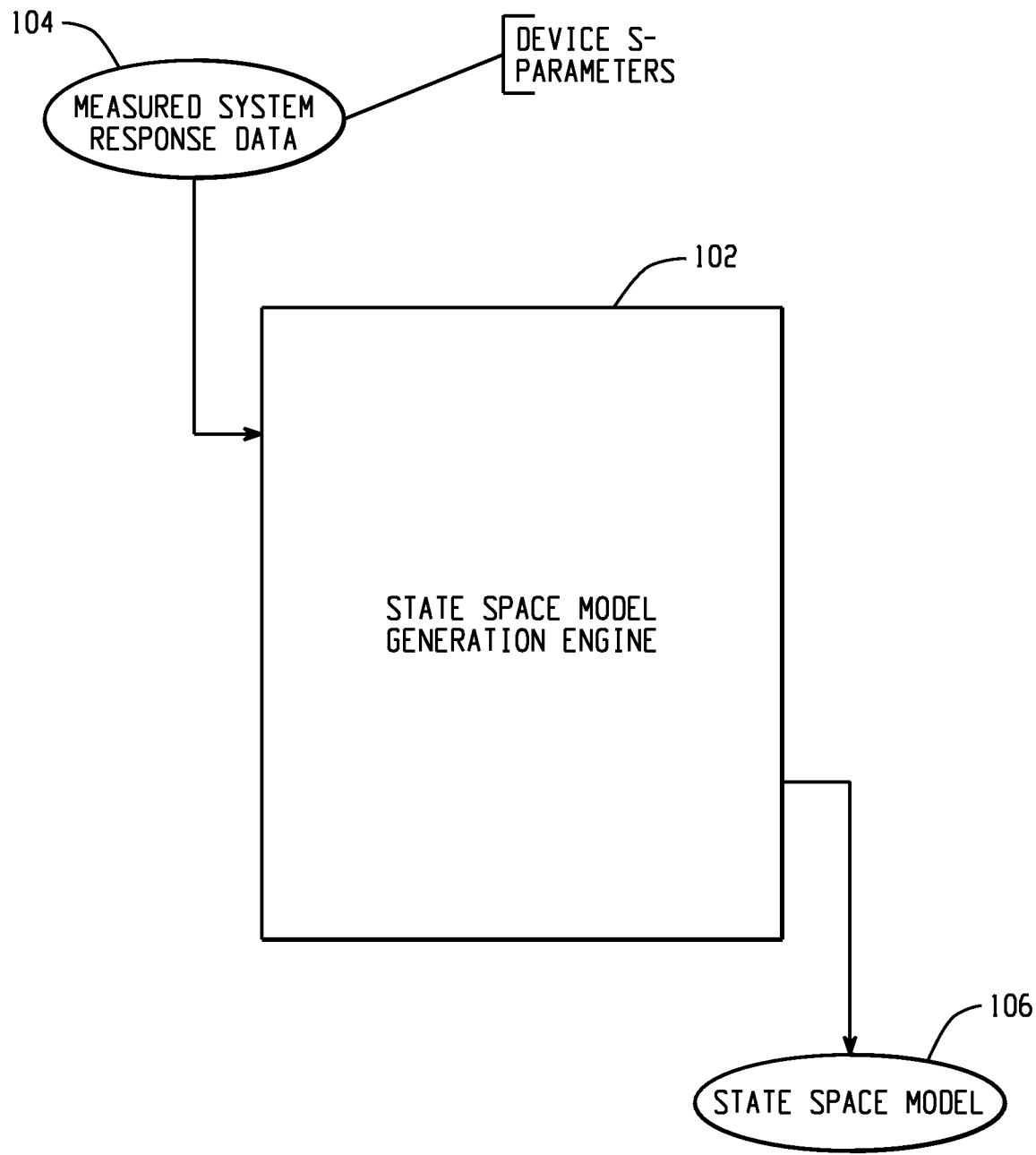
FIG. 1 is a diagram depicting a state space model generation engine.

FIG. 1 is a diagram depicting a state space model generation engine. A state space model generation engine 102 receives input data 104 indicative of a physical system to be modeled. In one example, the state space model generation engine 102 receives measured system response data 104 extracted from tests or simulation of the physical system. In one embodiment, the measured system response data 104 is s-parameter data extracted from a multi-port electronic device, where the s-parameter data indicates port-to-port responses to application of signals at different frequencies to different ports of the electronic device. The input data 104 is utilized by the state space model generation engine 102 to generate a state space model 106 of the system that can be used to simulate behavior of the physical system, such as via a system-level time-domain simulation.

Certain methods of generating a state space model of a physical system (e.g., vector fitting) can produce a model in an acceptable period of time. More robust model generation algorithms (e.g., Loewner-matrix-based algorithms) can be prohibitively expensive in terms of time and processing resources. In one example, a singular value decomposition (SVD) of a Loewner matrix s computed to construct a state space model. In that example, for large data sets (e.g., s-parameter data sets that are based on electronic devices having a large number of ports or where a large number of frequencies are represented), the computational cost of determining an SVD of the Loewner matrix has traditionally been prohibitive.

The state space model generation engine 102 of FIG. 1 exploits the structure of the Loewner matrix and the decay of its singular values, which tends to be rapid in typical applications, to accelerate the computation of an SVD of the matrix. A Loewner matrix is the solution of a certain Sylvester equation, whose right-hand-side is given in factored form. For such equations, an iterative method can be utilized for computing the solution in factored form. This enables determining a solution without forming the Loewner matrix explicitly. Only its typically much smaller factors are computed in determining an SVD of the Loewner matrix.

Figure 2:
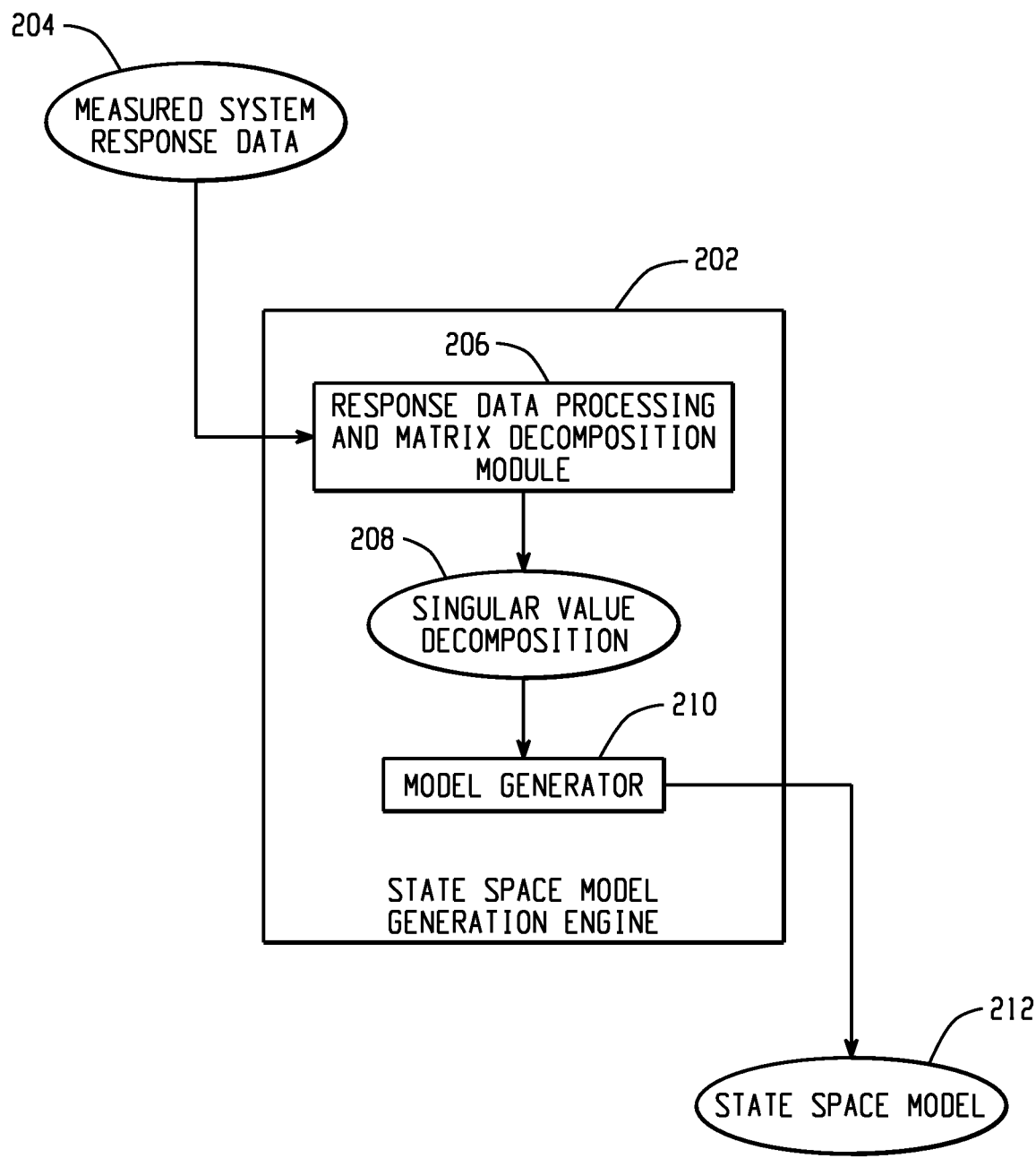
FIG. 2 is a block diagram depicting example operations of a state space model generation engine.

FIG. 2 is a block diagram depicting example operations of a state space model generation engine. The engine 202 receives input data 204, such as measured or simulated system response data. That data 204 is provided to a response data processing and matrix decomposition module 206. The response data processing and matrix decomposition module 206 determines a singular value decomposition 208 based on the input data 204. The singular value decomposition 208 is provided to a model generator 210 that generates and outputs a state space model 212 that can be used for simulation of the physical system represented by the input data 204.

Problem Specification

In Loewner-matrix-based methods, the frequencies and corresponding transfer-function samples are divided into two disjoint sets. Let $f \in \mathbb{R}^m$ and $f \in \mathbb{R}^n$ denote column vectors of the two sets of (possibly negative) frequencies, and let $H^a \in \mathbb{C}^{p \times q \times m}$ and $H^b \in \mathbb{C}^{p \times q \times n}$ denote their corresponding arrays of samples of transfer functions. For each frequency, the transfer function samples are therefore arranged as p×q complex matrices, representing a system with p outputs and q inputs. With these data, we associate a Loewner matrix, L, whose (j, i) block is given by, $$L_{j,i} = \frac{1}{2\pi\sqrt{-1}} \frac{H_j^a - H_i^b}{f_j^a - f_i^b}, i = 1, 2, \ldots, n, \text{ and} \quad (1)$$
$$j = 1, 2, \ldots, m$$

where the matrices $H_j^a$ and $H_i^b$ denote, respectively, the samples for frequencies $f_j^a$ and $f_i^b$. An SVD of this matrix can be utilized to construct a state-space model, as described, for example, in U.S. Pat. No. 8,504,345, entitled "State-space Model-Based Simulators and Methods," the entirety of which is herein incorporated by reference.

The state space model generation engine 102 utilizes an algorithm that relies on an observation that every Loewner matrix is the solution of an appropriate Sylvester equation, $$AL - LB = GF^H, \quad (2)$$

where the H superscript denotes the Hermitian transpose, and A and B are diagonal matrices with diagonal entries $$\text{diag}(A) = 2\pi\sqrt{-1} f^a \otimes 1_p, \text{diag}(B) = 2\pi\sqrt{-1} f^b \otimes 1_q. \quad (3)$$

In (3), the ⊗ symbol denotes the Kronecker product, and $1_\alpha$ denotes a size-α column-vector of ones. The data are arranged in the F and G matrices, $$G = \begin{pmatrix} H_1^a & -I_p \\ H_2^a & -I_p \\ \cdots & \cdots \\ H_m^a & -I_p \end{pmatrix}, F^H = \begin{pmatrix} I_q & I_q & \cdots & I_q \\ H_1^b & H_2^b & \cdots & H_n^b \end{pmatrix}, \quad (4)$$

in which $I_\alpha$ denotes the size-α identity matrix. Given A, B, G, and F, the state space model generation engine computes an SVD of L, $L = U\Sigma V^H$, where U and V have orthonormal columns, and Σ is a diagonal matrix with positive entries, sorted in descending order.

First and Second Techniques for Computing an SVD of an Input Matrix

As described in further detail below, SVDs of certain small matrices can be computed quickly using a standard first technique. Additionally, SVDs of certain other matrices can be computed relatively quickly using the following second technique.

The second technique begins with selection of two sets of shift parameters $\alpha_i$, with i=1, 2, . . . , m and with $\beta_j$=1, 2, . . . , n, which are set equal to the unique diagonal entries of A and B, respectively. The ordering of the shift parameters is discussed further herein below. The shift-parameters are used to generate two sequences of matrices as follows. For k=1, 2, . . .

$$P_k = [P^{(1)}, P^{(2)}, \ldots, P^{(k)}], \quad (6)$$

with $$P^{(1)} = \text{orth}((A - \beta_1 I)^{-1} G), \quad (7a)$$

$$P^{(i+1)} = \text{orth}([P_i, (A - \alpha_i I)(A - \beta_{i+1} I)^{-1} P^{(i)}]), \text{ and} \quad (7b)$$

$$Q_k = [Q^{(1)}, Q^{(2)}, \ldots, Q^{(k)}], \quad (8)$$

with $$Q^{(1)} = \text{orth}((B - \alpha_1 I)^{-H} F), \quad (9a)$$

$$Q^{(i+1)} = \text{orth}([Q_i, (B - \beta_i I)^H (B - \alpha_{i+1} I)^{-H} Q^{(i)}]). \quad (9b)$$

Here, the orth(•) operator means orthonormalization, by the standard QR-decomposition in (7a) and (9a), and by the block-Gram-Schmidt method in (7b) and (9b). This orthonormalization is a first departure from standard factored-ADI (Alternating-Direction Implicit) algorithms. The idea behind it is as in the Arnoldi iteration, namely, to ensure the steady increase with k of the numerical rank of the $P_k$ and $Q_k$. Additionally, while in the usual ADI method the generation of these sequences requires the solution of k(q+p) linear systems, in the present case the inverse matrices in (7b) and (9b) can be computed trivially, as A and B are diagonal.

At each k, the subspace colsp($P_k$) is a k(p+q)-dimension approximation for the column-space of L, and the subspace colsp($Q_k^H$) is a k(p+q)-dimension approximation for the row-space of L. Given these approximations, the algorithm finds an approximate SVD using a Galerkin projection. A projected Sylvester equation is formed, $$(P_k^H A P_k)\hat{L}_k - \hat{L}_k(Q_k^H B Q_k) = (P_k^H G)(F^H Q_k), \quad (10)$$

which, owing to its small size, can be solved by standard dense-matrix methods such as that of Bartels and Steward.

Standard SVD routines are also utilized to compute an SVD of the small, k(p+q)×k(p+q), matrix $\hat{L}_k$, $$\hat{L}_k = \hat{U}_k \hat{\Sigma}_k \hat{V}_k, \qquad (11)$$

which is used to approximate an SVD of L, $$U \approx U_k = P_k \hat{U}_k, \Sigma \approx \Sigma_k, V \approx V_k = Q_k \hat{V}_k \qquad (12)$$

As the rank of $P_k$ and $Q_k$ increases with k, the above approximation improves on each iteration. Determining how good the approximation is at any stage is not trivial, but can be done by estimating the norm of the residual, $R_k$, of the original Sylvester equation (2) at the k-th iteration, $$R_k = AL_k - L_k B - GF^H, \qquad (13)$$

where $L_k = U_k \Sigma_k V_k^H$. The matrices involved in (13) are often too large to be formed explicitly. However, the spectral norm of $R_k$, $$\|R_k\|_2 = \sqrt{\lambda_{max}(R_k^H R_k)} = \sqrt{\lambda_{max}(R_k R_k^H)} \qquad (14)$$

with $\lambda_{max}$ representing the largest eigenvalue, can be evaluated without forming $R_k$ explicitly, using a technique. The matrix-vector product for $R_k$ and $R_k^H$ can be computed quickly based on them being given in terms of factored and diagonal matrices. Using this matrix-vector product, $\|R_k\|^2$ can be estimated accurately with just a few power iterations applied to $R_k R_k^H$ or $R_k^H R_k$, whichever is smaller. The algorithm can then reliably stop the iterations once $\|R_k\|_2$ has dropped below a given error tolerance.

Figure 3:
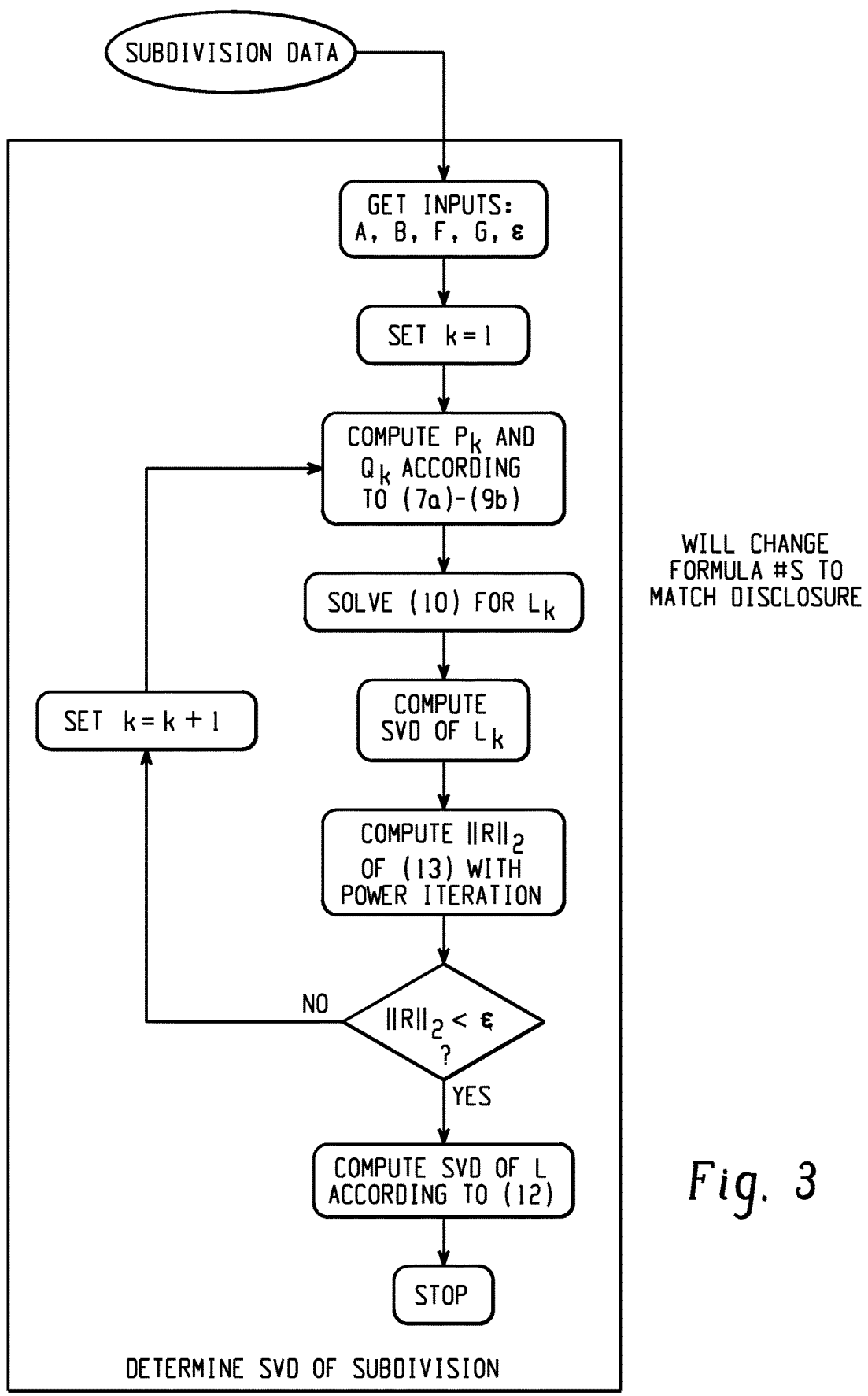
FIG. 3 is a flow diagram depicting a method of computing an SVD of a subdivision of a matrix according to the second technique.

FIG. 3 is a flow diagram depicting a method of computing an SVD of a subdivision of a matrix according to the second technique described above, where providing a subdivision as an input to the algorithm is described in further detail herein.

As noted above, shift parameter selection can affect performance of the second technique described above. Equation (2) can be rewritten as a linear system of size (mnpq)×(mnpq) using the vec column-stacking operator, $$(I_n \otimes A - B \otimes I_m) \text{vec}(L) = \text{vec}(GF^H). \qquad (15)$$

The system matrix $D = (I_n \otimes A - B \otimes I_n)$ is diagonal, and its entries are $2\pi\sqrt{-1}(f_i^a - f_i^b)$. If the frequency sets are well-separated, so that none, or only a few, of these entries is small compared to the largest frequency difference, the matrix D is well-conditioned. This often results in rapid convergence, particularly with the following choice of shift-parameters, $$\alpha_i = 2\pi\sqrt{-1}\, f_i^a, \; i = 1, 2, \ldots, m, \; f_1^a < f_2^a < \ldots < f_m^a, \qquad (16)$$
$$\beta_j = 2\pi\sqrt{-1}\, f_j^b, \; j = 1, 2, \ldots, n, \; f_1^b < f_2^b < \ldots < f_n^b,$$

in which it is assumed that $f_1^a > f_n^b$. This selection strategy implies that the sub-spaces generated in the first iterations correspond to the approximate null-space of D, while the later ones correspond to the dominant subspace of D. Qualitatively, once the iterations pass to the dominant subspace, the convergence is fast. If the $f_i^a$ are smaller than the $f_j^b$, the $f_j^b$ can be sorted in ascending order and the $f_i^a$ in descending order to obtain similar convergence behavior.

The partitioning scheme for dividing the frequencies between the $f_a$ and $f_b$ vectors varies in different embodiments. In one example, all frequencies are sorted and $f_a$ is set to the frequencies larger than the median and $f_b$ is set to the rest. This leads to a well-conditioned D and rapid convergence of the ADI-Galerkin algorithm described above with respect to FIG. 3. However, certain numerical experiments have found that different partitioning schemes can yield even better state-space models in many instances. For example, partitioning consisting of using every other of the sorted frequencies for $f_a$ and the rest for $f_b$ results in the spectra of A and B being interlaced. As the spectra are not well-separated in this case, this choice, though beneficial for the accuracy of the fit in general, results in slow convergence of the ADI-Galerkin algorithm. In such cases, a partitioning scheme as described below can be utilized to simplify the matrices processed by the second technique in some instances.

Matrix Decomposition Algorithm

The matrix decomposition algorithm is inspired by the analogy between the Loewner matrix and a discretization of the integral operator $$Lx = \frac{1}{2\pi\sqrt{-1}} \int_{s_1}^{s_2} x(s) \frac{H(s) - H(t)}{s - t} ds, \text{ for } t \in [t_1, t_2] \qquad (17)$$

where H(s) is a p×q transfer-function matrix. For such operators, there are divide-and-conquer algorithms, such as the fast multipole method, which partition the discretization nodes into well-separated groups. For the interactions between these groups, a low-rank approximation is possible, while within each group a direct evaluation of the operator is utilized. This high level concept is incorporated into the matrix decomposition algorithm with certain adjustments.

Figure 4:
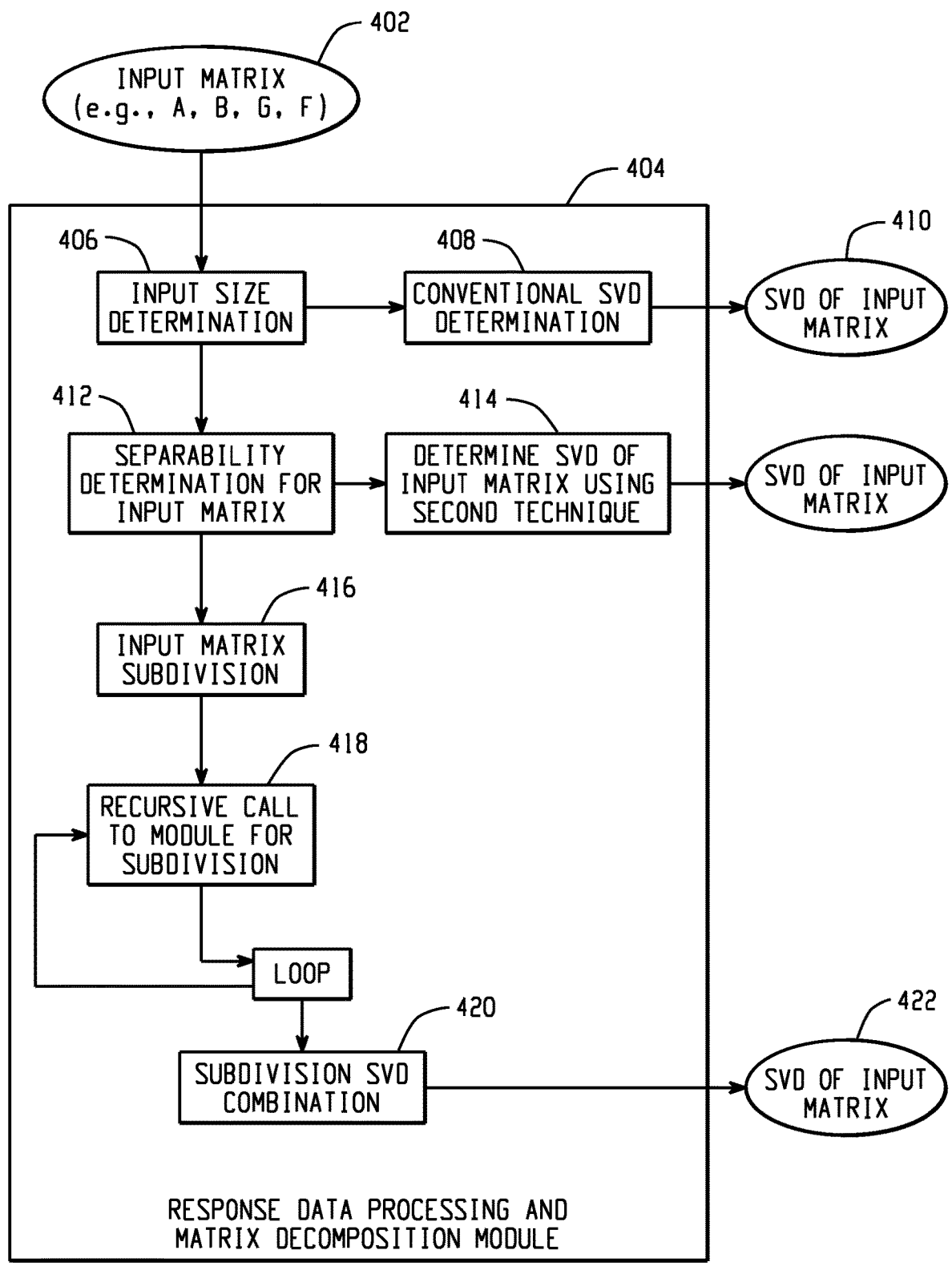
FIG. 4 is a flow diagram depicting an example recursive algorithm performed by a response data processing and matrix decomposition module.

FIG. 4 is a flow diagram depicting an example recursive algorithm performed by a response data processing and matrix decomposition module. At 402, input data (e.g., A, B, G, and F matrices) associated with an input matrix is received by the response data processing and matrix decomposition module 404. If A and B are small enough for use of a standard SVD routine at 406, the standard technique is performed at 408 and an SVD of the input matrix is outputted at 410. Otherwise, a check is performed at 412 to determine whether the input matrix is well-separated (e.g., the ratio of smallest to largest frequency difference is larger than some δ<1). If the input matrix is well-separated, a technique, such as the ADI-Gakerkin second technique described above is utilized at 414 for the input matrix. Otherwise, the input matrix is subdivided at 416. For example, the frequencies $f_a$ are divided into two groups: one, $f_+^a$, with frequencies larger than the median frequency, and one, $f_-^a$, with frequencies smaller or equal to the median frequency. The frequencies $f_b$ are similarly divided into $f_+^b$ and $f_-^b$, A into $A_+$ and $A_-$, B into $B_+$ and $B_-$, F into $F_+$ and $F_-$, and G into $G_+$ and $G_-$. This results in four sub-problems corresponding to the pairs $(f_-^a, f_-^b)$, $(f_-^a, f_+^b)$, $(f_+^a, f_-^b)$, and $(f_+^a, f_+^b)$.

The matrix decomposition algorithm is then called recursively to solve each of these sub-problems at 418. Once SVDs for all four sub-problems are obtained (which can be computed in parallel), those SVDs of the matrix blocks are combined into one SVD for the entire Loewner matrix at 420 and outputted at 422.

In one embodiment of the disclosure, SVDs of sub-problems are combined as follows. The SVDs computed for each of the above-mentioned sub-problems correspond to SVDs of blocks of the original Loewner matrix. The last step is to combine these SVDs, $$L = \begin{pmatrix} U_{11}S_{11}V_{11}^H & U_{12}S_{12}V_{12}^H \\ U_{21}S_{21}V_{21}^H & U_{22}S_{22}V_{22}^H \end{pmatrix}, \quad (18)$$

so as to obtain an SVD of L. Equation 18 can be rewritten as:

$$L = \begin{pmatrix} U_{11}U_{12} & \\ & U_{21}U_{22} \end{pmatrix} \begin{pmatrix} S_{11} & & & \\ & S_{12} & & \\ & & S_{21} & \\ & & & S_{22} \end{pmatrix} \begin{pmatrix} V_{11}^H & \\ & V_{21}^H \\ V_{12}^H & \\ & V_{22}^H \end{pmatrix}. \quad (19)$$

The QR-decomposition can be used to obtain:

$$Q_u R_u = \begin{pmatrix} U_{11}U_{12} & \\ & U_{21}U_{22} \end{pmatrix}, Q_v R_v = \begin{pmatrix} V_{11} & V_{21} \\ V_{12} & V_{22} \end{pmatrix}. \quad (20)$$

These QR-decompositions require only modest computational resources because the matrices involved typically have few columns. Also, the computation can be expedited further because the matrix blocks already have orthogonal columns. L can then be written as $$L = Q_u R_u S R_v^H Q_v^H \quad (21)$$

where S is the (block)-diagonal matrix in (19). An SVD of the small matrix $M = R_u S R_v^H$ is computed with the conventional technique as $$M = U_m \Sigma V_m^H \quad (22)$$

to obtain an SVD of L as $$L = U \Sigma V^H, U = Q_u U_m, V = Q_v V_m. \quad (23)$$

To speed-up the computation, it is possible to truncate singular values that are smaller than a user prescribed tolerance, and with them, their corresponding singular vectors. This can be especially beneficial when the depth of the recursion is significant.

Figure 5:
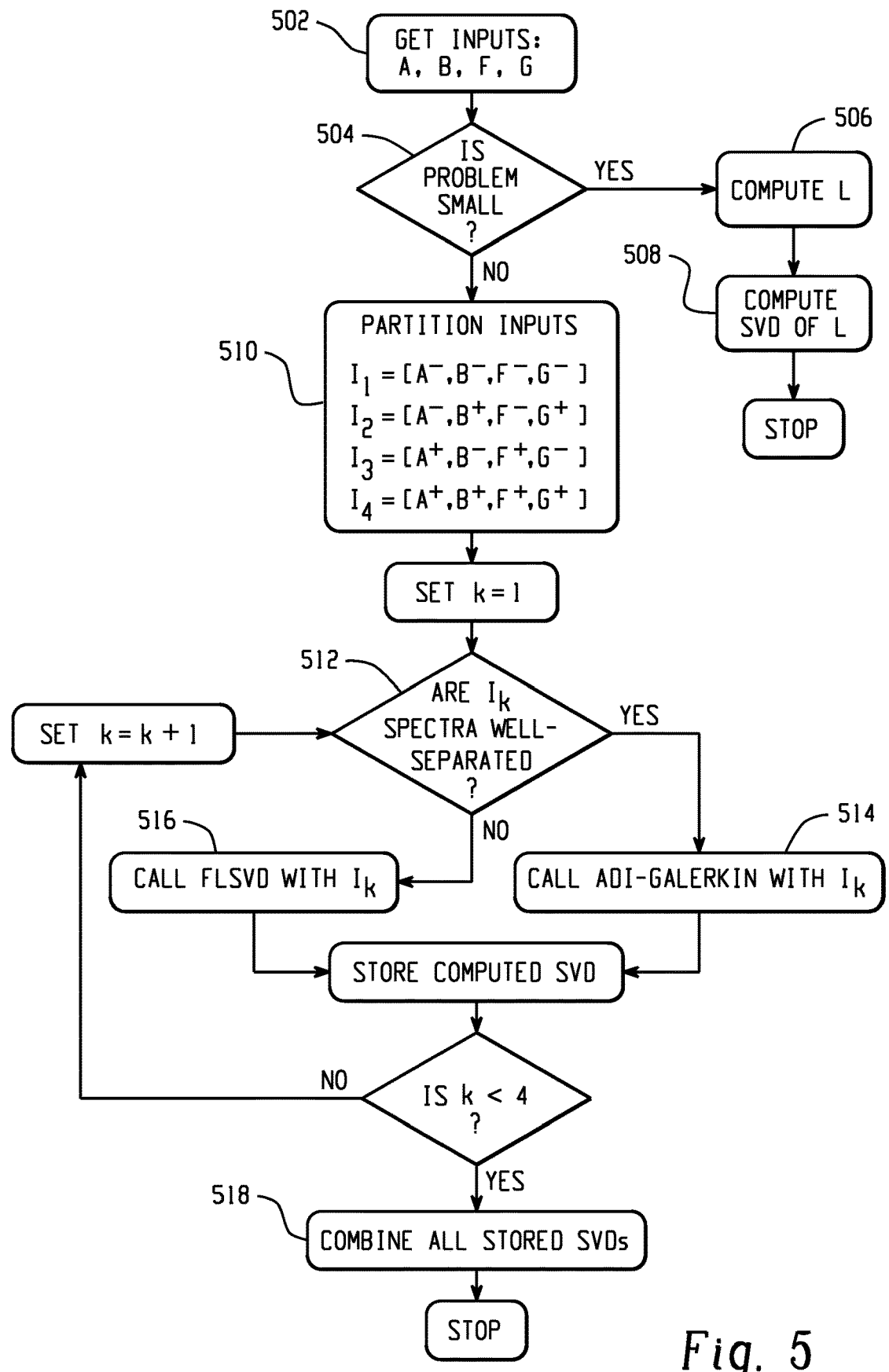
FIG. 5 is a flow diagram depicting another example matrix decomposition algorithm.

FIG. 5 is a flow diagram depicting another example matrix decomposition algorithm. At 502, input data associated with an input matrix is received at a matrix decomposition module. At 504, a determination is made as to the size of the input matrix based on the input data. When the input matrix size is below a threshold, the input matrix is computed at 506, and an SVD of that input matrix is determined using a first technique at 508. When the input matrix size is above the threshold, at 510, the input matrix is divided into subparts (e.g., four subparts). A loop iteration is performed for each subpart. At 512, a determination of a separability value for a subpart is made. When the separability value indicates that the subpart is well separated, an SVD for that subpart is determined at 514 (e.g., using the ADI-Galerkin second technique) and stored. When the separability value indicates that the subpart is not well separated, data associated with that subpart is provided to the matrix decomposition module via a recursive call at 516. An SVD value from that recursive call is received and stored. Once all of the subparts are processed, the subpart SVDs are combined at 518 and outputted.

Figure 6:
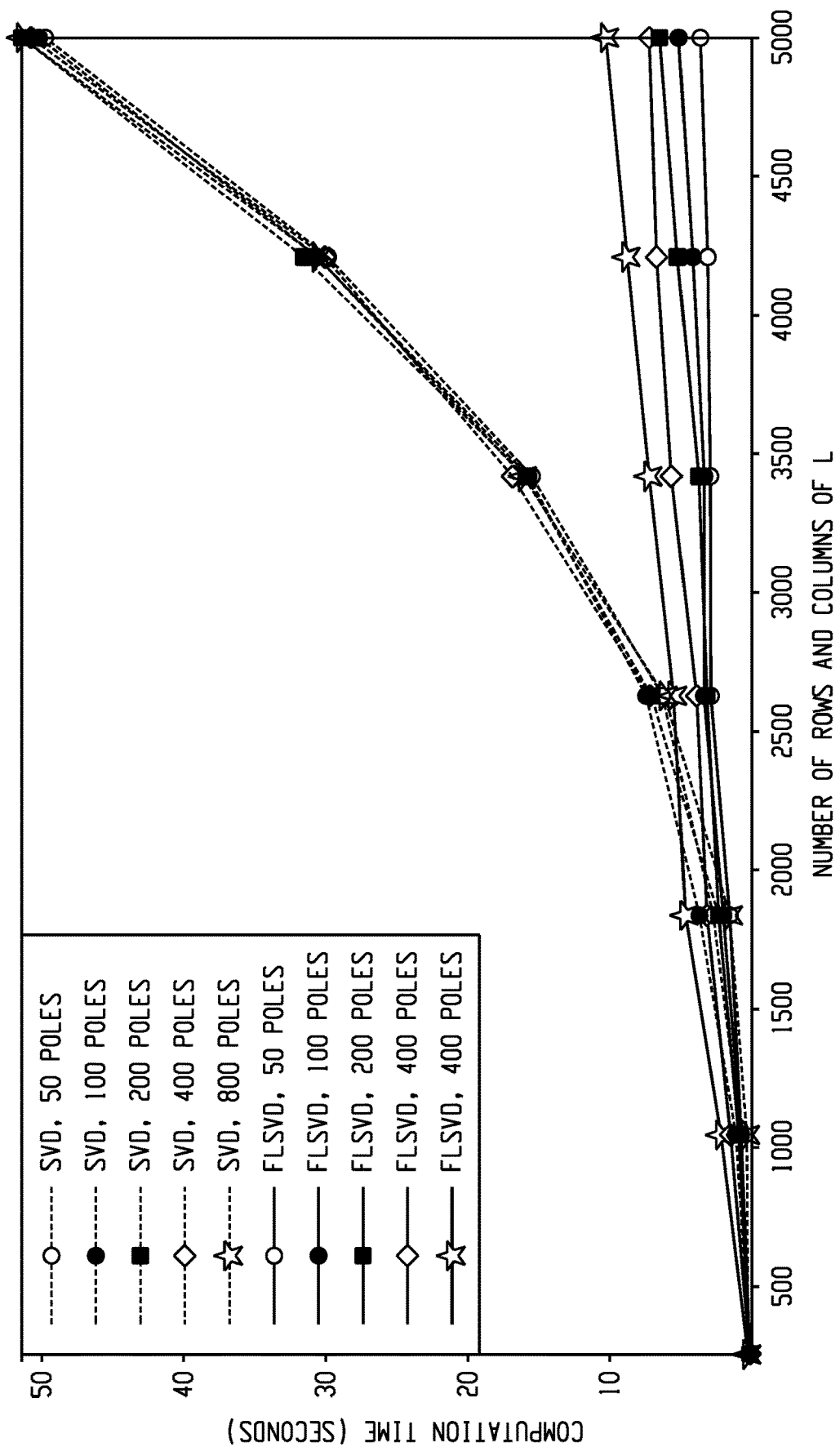
FIG. 6 is a diagram depicting increased performance of systems using the matrix decomposition algorithm versus systems using traditional methods.

FIG. 6 is a diagram depicting increased performance of systems using the matrix decomposition algorithm (FLSVD) versus systems using traditional methods (SVD), with processing that utilized the matrix decomposition algorithm exhibiting linear increases in processing time as the underlying input data increases in size, while processing that utilized traditional methods exhibited an cubic increase in processing time.

This application uses examples to illustrate the invention. The patentable scope of the invention includes other examples. For example, the examples described herein operate on Loewner matrices. Certain methods may equally be applied to Hankel matrices, used to generate state-space models from samples in the time-domain of a system's responses to various inputs.

It is claimed:

1. A computer-implemented system of generating a state space model of a physical system, comprising:
   a matrix decomposition module, the matrix decomposition module being configured to determine a singular value decomposition of an input matrix based on measured system response data extracted from a first physical system comprising a first electronic circuit, the matrix decomposition module being configured to:
   receive the measured system response data for use as input data;
   determine a size of an input matrix based on the measured system response data;
   when the input matrix size is below a threshold, determine a singular value decomposition of the input matrix using a first technique that is based on a standard singular value decomposition technique;
   when the input matrix size is above the threshold:
      subdivide the input matrix into a plurality of subparts;
      for each subpart
         determine a separability value of that subpart;
         when the separability value indicates that the subpart is well separated, determine a singular value decomposition of that subpart using a second technique that is based on singular value decomposition determination separately for each subpart;
         when the separability value indicates that the subpart is not well separated, provide data to the matrix decomposition module via a recursive call to subdivide the data and determine a singular value decomposition for each subdivided data using the second technique applied to each subdivided data and the singular value decomposition of the subpart by combining the singular value decomposition of each subdivided data;
      combine the singular value decompositions of each of the subparts to determine the singular value decomposition of the input matrix;
   output the singular value decomposition of the input matrix;
   a model generation module configured to generate a state space model of the first physical system based on a singular value decomposition determined by the matrix decomposition module; and
   a simulation module configured to simulate a response of a second physical system comprising a second electronic circuit using the generated state space model, wherein the second electronic circuit is operated based on the outputs of the simulation.

2. The system of claim 1, wherein the matrix decomposition module is configured to output the singular value decomposition without utilizing a data structure that simultaneously contains all data of the input matrix when the input matrix is determined to be above the threshold.

3. The system of claim 1, wherein the second technique comprises:
determining an approximate singular value decomposition of that subpart;
determining an error value for the approximate singular value decomposition of that subpart;
repeating the determining an approximate singular value decomposition and determining the error value for the approximate singular value decomposition until the error value meets an error threshold.

4. The system of claim 3, wherein the approximate singular value decomposition of that subpart is determined using a Galerkin projection.

5. The system of claim 3, wherein the approximate singular value decomposition of that subpart is determined by forming a Sylvester equation.

6. The system of claim 5, wherein the approximate singular value decomposition of that subpart is determined by performing a Bartels and Steward operation to solve the Sylvester equation.

7. The system of claim 5, wherein the Sylvester equation is formed based on a set of shift parameters.

8. The system of claim 3, wherein the error value for the approximate singular value decomposition of that subpart is determined by estimating a norm of a residual of a Sylvester equation.

9. The system of claim 3, wherein the second technique is an Alternating-Direction Implicit (ADI)-Galerkin technique.

10. The system of claim 1, wherein the first technique and the second technique are the same technique.

11. The system of claim 1, wherein the matrix decomposition module is configured to subdivide the input matrix into four parts.

12. The system of claim 1, wherein the input matrix is a Loewner matrix.

13. The system of claim 1, wherein the input matrix is a Hankel matrix.

14. A computer-implemented method of generating a state space model for reducing computation time required to generate a state space model of a physical system for use in simulating physical system responses, the method comprising:
receiving measured system response data extracted from a first physical system comprising a first electronic circuit for use as input data;
providing the measured system response data to a matrix decomposition module configured to determine a singular value decomposition of an input matrix based on the measured system response data;
determining a size of the input matrix based on the measured system response data;
when the input matrix size is below a threshold, determining a singular value decomposition of the input matrix using a first technique that is based on a standard singular value decomposition technique;
when the input matrix size is above the threshold:
subdividing the input matrix into a plurality of subparts;
for each subpart
determining a separability value of that subpart;
when the separability value indicates that the subpart is well separated, determining a singular value decomposition of that subpart using a second technique that is based on singular value decomposition determination separately for each subpart;
when the separability value indicates that the subpart is not well separated, providing data to the matrix decomposition module via a recursive call to subdivide the data and determining a singular value decomposition for each subdivided data using the second technique applied to each subdivided data and the singular value decomposition of the subpart by combining the singular value decomposition of each subdivided data;
combining the singular value decompositions of each of the subparts to determine the singular value decomposition of the input matrix;
outputting the singular value decomposition of the input matrix;
generating a state space model of the first physical system based on a singular value decomposition determined by the matrix decomposition module;
simulating a response of a second physical system comprising a second electronic circuit using the generated state space model, wherein the second electronic circuit is operated based on the outputs of the simulation.

15. The method of claim 14, wherein the matrix decomposition module is configured to output the singular value decomposition without utilizing a data structure that simultaneously contains all data of the input matrix when the input matrix is determined to be above the threshold.

16. The method of claim 14, wherein the second technique comprises:
determining an approximate singular value decomposition of that subpart;
determining an error value for the approximate singular value decomposition of that subpart;
repeating the determining an approximate singular value decomposition and determining the error value for the approximate singular value decomposition until the error value meets an error threshold.

17. The method of claim 16, wherein the approximate singular value decomposition of that subpart is determined using a Galerkin projection.

18. The method of claim 16, wherein the approximate singular value decomposition of that subpart is determined by forming a Sylvester equation.

19. The method of claim 18, wherein the approximate singular value decomposition of that subpart is determined by performing a Bartels and Steward operation to solve the Sylvester equation.

20. The method of claim 18, wherein the Sylvester equation is formed based on a set of shift parameters.

21. The method of claim 16, wherein the error value for the approximate singular value decomposition of that subpart is determined by estimating a norm of a residual of a Sylvester equation.

22. The method of claim 14, wherein processing time of the matrix decomposition module scales linearly with the size of the input matrix.

23. The method of claim 14 further comprising:
testing the first physical system;
extracting the measured system response data from the testing of the first physical system, wherein the extracted measured system response data is s-parameter data extracted from the first electronic circuit.

* * * * *